(12) United States Patent
Choudur et al.

(10) Patent No.: US 9,405,731 B2
(45) Date of Patent: Aug. 2, 2016

(54) ENERGY-BASED WAVELET THRESHOLDING

(75) Inventors: Lakshminarayn Choudur, Austin, TX (US); Pramod Singh, Austin, TX (US); Umeshwar Dayal, Saratoga, CA (US); Chetan Kumar Gupta, Austin, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 1678 days.

(21) Appl. No.: 12/461,844

(22) Filed: Aug. 26, 2009

(65) Prior Publication Data

US 2011/0055222 A1 Mar. 3, 2011

(51) Int. Cl.
| | | |
|---|---|---|
| G06F 7/00 | (2006.01) |
| G06F 17/00 | (2006.01) |
| G06F 17/14 | (2006.01) |
| H03M 7/30 | (2006.01) |
| G06F 13/14 | (2006.01) |

(52) U.S. Cl.
CPC .............. *G06F 17/148* (2013.01); *H03M 7/30* (2013.01)

(58) Field of Classification Search
CPC ............ G06F 17/148; G06F 17/30271; G06F 17/30489; G06F 17/30536; G06F 17/30592; G06F 17/30256; G06F 17/30259
USPC ........... 324/309; 707/748, E17.014, E17.108, 707/999.003, E17.14, 756, 769, 999.107; 348/207.1, 220.1, 222.1, 229.1, 360, 348/384.1, 308, 241, 473; 382/128, 131, 382/165, 250, 268, 276, 169, 232; 704/223, 704/226, 230, 500; 375/240.04, 240.1
See application file for complete search history.

(56) References Cited

U.S. PATENT DOCUMENTS

| | | | | | |
|---|---|---|---|---|---|
| 5,530,478 | A | * | 6/1996 | Sasaki ................... | H04N 19/176 375/240.04 |
| 5,968,149 | A | * | 10/1999 | Jaquette .............. | G06F 11/1616 710/1 |
| 6,094,050 | A | * | 7/2000 | Zaroubi ................. | G01R 33/56 324/307 |
| 6,643,406 | B1 | | 11/2003 | Hajjahmad et al. | |
| 7,181,076 | B1 | | 2/2007 | Payton | |
| 2007/0132878 | A1 | * | 6/2007 | Tanaka ............... | H04N 5/23209 348/360 |

OTHER PUBLICATIONS

*An Introduction to Wavelets*, Amara Graps, 1995 Institute of Electrical and Electronics Engineers, Inc.; IEEE Computational Science and Engineering, 1995.

* cited by examiner

*Primary Examiner* — Usmaan Saeed
*Assistant Examiner* — Cecile Vo
(74) *Attorney, Agent, or Firm* — Law Office of Doug Weller

(57) ABSTRACT

A data processing system, implemented as programming on a suitably-programmed device includes a data input module that supplies a data input; and a wavelet transformation and compression module coupled to the data input module. The wavelet transformation and compression module receives a representation of the input data. The wavelet transformation and compression module includes an input module having a wavelet basis function, a wavelet coefficient generator that computes wavelet coefficients based on the wavelet basis function and the representation of the input data, a ranking module that orders the n wavelet coefficients, a coefficient multiplier that computes an energy value for each wavelet coefficient, an adder that iteratively computes cumulative energy as a function of the number of coefficients, and a comparator that computes total energy of the data input to the iterative, cumulative energy and selects a number of coefficients whose cumulative energy is substantially invariant with additional coefficients, wherein the selected number of coefficients results in compression of the data input.

20 Claims, 7 Drawing Sheets

ENERGY-BASED WAVELET THRESHOLDING

BACKGROUND

Data compression in applications often is performed using mathematical transform methods that permit capture of details in the data while at the same time representing the data in an efficient manner. One such data compression technique uses wavelet transforms.

Two well-known wavelet systems are the Haar and the Daubechies wavelet systems. Haar wavelets are easy to understand and implement, and serve as a convenient precursor to the much acclaimed Daubechies wavelets. Haar wavelets use a square wave basis function to detect large shifts in slowly changing data distributions and then produce a series of discontinuous square boxes of various sizes shifted along the time axis. In general, approximation by a Haar wavelet to complex data distributions requires many flat-top pieces to fit making compressibility difficult to achieve. However, Haar wavelets are suitable for modeling data whose low-pass component is the dominant feature and consists of sudden spikes. Daubechies wavelets are a family of orthogonal wavelets, characterized by a maximal number of vanishing moments over a compact interval. Daubechies wavelets model data by smooth, higher order polynomials that capture high frequency transitory behavior and as such represent an improvement over Haar's square-wave basis wavelets in some applications.

DESCRIPTION OF THE DRAWINGS

The detailed description will refer to the following drawings in which like numerals refer to like objects, and in which.

DETAILED DESCRIPTION

Figure 1A:
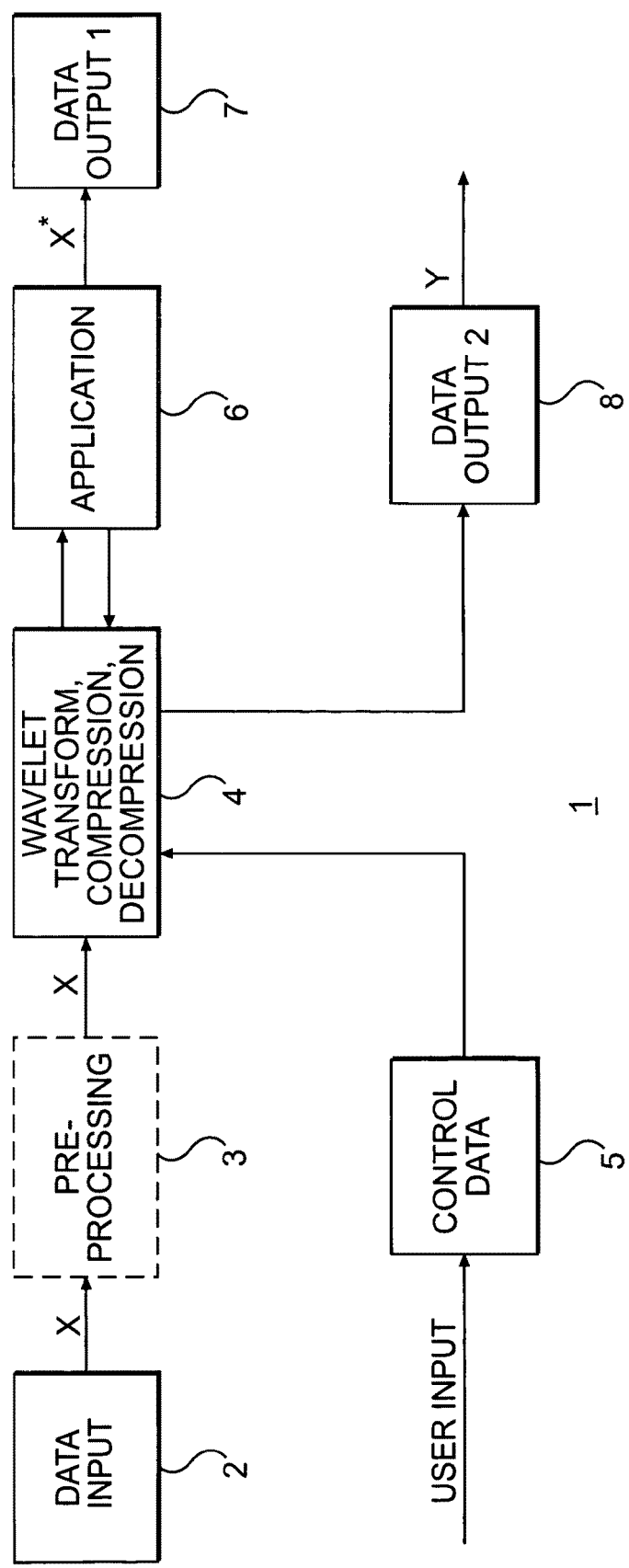
FIG. 1A is a simplified block diagram of an exemplary data processing system that includes hardware and that uses wavelet thresholding based on pre-specified accuracy.

Many applications, including digital image processing and database searching, for example, require access to large quantities of data. Because of the large data quantities involved, these applications typically employ some form of data compression so as to reduce the necessary storage and bandwidth requirements for associated hardware, and allow data extraction for editing, processing, and targeting of particular devices and operations. Many compression/decompression mechanisms are "lossy," meaning the decompressed data are not exactly the same as the original data before compression. However, lossy compression/decompression mechanisms are able to achieve a much greater compression ratio than conventional lossless methods. Furthermore, the loss of data often has little effect on the specific application.

Compression mechanisms may use an encoding technique known as a wavelet transformation. Wavelets are mathematical functions that parse data into different frequency components and then compare each component with a resolution matched to its scale. Wavelets are better suited than traditional Fourier (e.g., DCT) methods in analyzing physical situations where the signal contains discontinuities and sharp spikes, as often is the case in image processing. Wavelets also are useful when analyzing large quantities of structured and unstructured data, as might exist in a large database.

The basis functions of the wavelet transforms are small waves or wavelets developed to match signal discontinuities. The wavelet basis function of a wavelet has finite support of a specific width. Wider wavelets examine larger regions of the signal and resolve low frequency details accurately, while narrower wavelets examine a small region of the signal and resolve spatial details accurately. Wavelet-based compression has the potential for better compression ratios and less complexity than sinusoidal-based compression.

The main difference between a wavelet transform and the DCT is the way decomposition and reconstruction is accomplished. Instead of using cosine waves as with DCT, the wavelet transform uses short waves that start and stop with different spatial resolutions. While the DCT or the fast Fourier transform (FFT) have a set of fixed and well defined basis functions for a specified transform size, some wavelet mechanisms do not use a specific formula for the basis function but rather a set of mathematical requirements such as a smoothness condition and vanishing moment condition. Thus, the first step in wavelet analysis of the is to determine and designate the appropriate wavelet bases to use and that determination depends on the specific application. Designing and finding such wavelet bases to be designated for use is not a trivial task because it is mathematically involved. Fortunately, numerous researchers have designed a number of specific wavelet basis functions, the most famous and widely used of which are the Daubechies wavelets. Daubechies wavelets are effective for representing polynomial behavior.

Database search applications rely on data compression mechanisms to optimize search results, contend with limited bandwidth, and minimize the need of extra storage, all of which objectives translate into reduced costs associated with the database searches. For example, with an ever increasing need for business intelligence to support critical decision-making, and for compliance with an ever-increasing legal regimes as exemplified by the Sarbanes-Oxley legislation, companies are required to store and access (query) mammoth amounts of structured and unstructured data. This leads to a need for advanced data compression techniques to improve the efficiency of information management with regards to storage, transmission, and analysis. Real-time business intelligence puts a heavy burden on the query optimization in database systems.

The algorithms used to implement compression in database search applications may be implemented in both software and hardware.

FIG. 1A is a simplified block diagram of an exemplary data processing system 1 that uses wavelet thresholding based on pre-specified accuracy. The system 1 may be implemented in many diverse applications, and is particularly suited to data-intensive processing, particularly searching large databases. Another example of such an application is the digital image processing occurring in a digital camera, including cameras installed on cellular telephones. Considering the large amount of memory required to store or transmit a single digital image in uncompressed digital form, it would be desirable to compress the digital image data before storage or transmission in such a way that the compressed digital data could later be decompressed to recover the original image data for viewing. Other examples of applications that would benefit from wavelet thresholding based on pre-specified accuracy include image processing and transmission applications, including Web-based image transfer, medical imaging applications, and database search engines.

In FIG. 1A, the processing system 1 includes data input module 2, optional pre-processing module 3, wavelet transformation, compression, and decompression module 4, control data input module 5, application 6, decompression module 6, and data output modules 7 and 8. The functions and operations of the wavelet transformation, compression, and decompression module 4 will be described in more detail with respect to FIG. 1C. As an alternative to the architecture shown in FIG. 1A, the compression and decompression actions may be completed in a module separate from the transformation and compression actions.

Figure 1B:
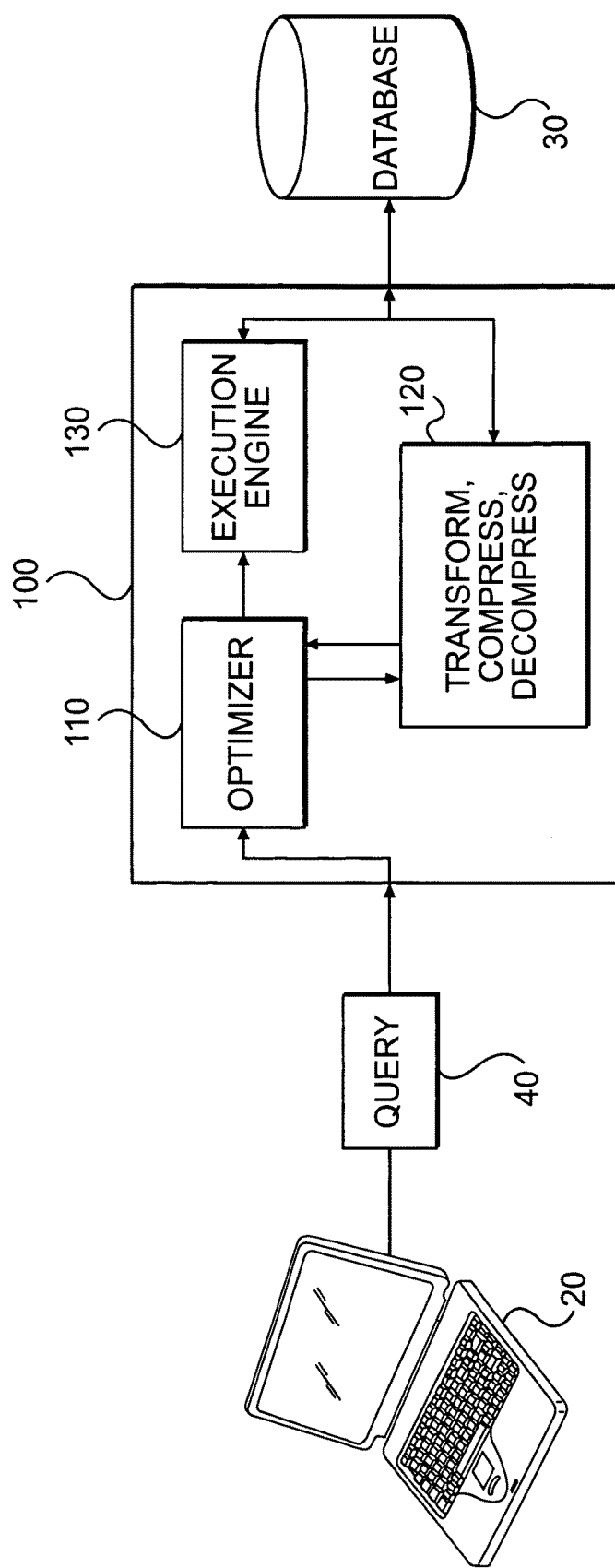
FIG. 1B is a simplified block diagram of an exemplary database system that uses optimized data compression techniques including wavelet thresholding based on pre-specified accuracy.

FIG. 1B is a simplified block diagram of an exemplary database system 10 that uses wavelet thresholding based on pre-specified accuracy to achieve optimized data compression and consequently efficient database searching. The database system 10 includes computing platform 20, database 30, and database search system 100. The computing platform 20 may be a personal computer (PC), for example, which allows a human operator to set up and launch queries 40 of database 30. The database 30 may comprise columns and rows of data, arranged in one or more tables. Other structures are possible with the database 30. Although not shown, another computing platform may operate autonomously of any direct human intervention to make queries 40 of the database 30. In other words, a suitably programmed processor may execute routine or periodic queries, or may execute episodic queries based on the occurrence of pre-specified events. In either case of the computing platform 20 or an autonomous computing platform, the end result is a query 40 that is presented to components of the database search system 100.

The database search system 100 includes query optimizer 110, compression module 120, and execution engine 130. The compression module 120 will be described in detail with reference to FIG. 1C. The query optimizer 110 determines query plans that the execution engine 130 uses to fulfill the query 40. A query plan might designate the order of searching columns of data in the database 30, for example. One function of the query optimizer 110 is to estimate approximate cardinalities of columns based on which query plan is generated. As will be discussed below, the compression module 120 is used to increase the query optimizer's performance. Inaccurate estimation can have disastrous consequences in down stream query execution.

The compression module 120 uses wavelet-based compression techniques combined with variable thresholding (i.e., thresholding based on a pre-determined level of accuracy) to enable the query optimizer 110 to construct the most efficient query plan given specific inputs (the query 40) from the computing platform 20. The optimizer 110 may sample data in various columns or tables of the database 30 and then use the compression module 120 to perform a wavelet transform and threshold operation to determine the optimum query plan.

The wavelet transform uses a wavelet prototype function, often called a mother wavelet, and denoted herein by $\psi$. To complete the specification of a wavelet, another term, called a father wavelet, or scaling function, and denoted herein by $\phi$, is used. The mother wavelet is obtained by scaling and translating the father wavelet. Temporal analysis is performed with a contracted, high-frequency version of the mother wavelet, while frequency analysis is performed using a dilated, low-frequency version of the same mother wavelet. Because the original signal or function can be represented in terms of a wavelet expansion, using coefficients in a linear combination of the wavelet function, data operations can be performed using just the corresponding wavelet coefficients. Thus, a wavelet expansion of a function requires a set of basis elements that are obtained through a series of dilation and translation operations. The resulting vectors are orthogonal to one another over a compact support. Dilating and translating the mother wavelet results in a sequence of nested vector subspaces leading to multi-resolution analysis (MRA). Multi-resolution analysis involves decomposing data at various levels known as resolutions. The data at a certain resolution are composed by combining its "cousins" at a higher level of resolution. In other words, the wavelet coefficients can be obtained at various levels, approximating the data with greater and greater precision as resolution increases. Conversely as the resolution decreases, the result is smoothed versions of the signal, or data.

Compression begins after the selection of a suitable wavelet basis. The wavelet basis may be specified by the user in conjunction with submitting the query 40. More often, the applicable wavelet bases will be determined in advance and may be assigned automatically based on the query 40, or may be selectable from a list of available wavelet bases. The wavelet basis is used to model the attribute distribution (y), which can be described by the equation $$y = \alpha\phi(x) + \sum_{j=0}^{m} \sum_{k=0}^{2^j-1} \beta_{jk}\psi_{jk}(x)$$

where the set $\{\alpha, \beta_{j,k}\}$ represents the set of wavelet coefficients and $m=\log_2(n)$. The wavelet coefficients can be generically represented by the set $\{c_i\}_{i=1}^n$. These coefficients measure the degree of association between the attribute values and the wavelet basis. In many applications, the majority of wavelet coefficients will be negligible in magnitude and thus do not contribute to describing the data subjected to the wavelet transform. Therefore, these non-value added coefficients can be discarded. The resulting set $\{c_i\}_{i=1}^k$, $k<<n$ is represents the compressed data. The process of discarding small magnitude coefficients to achieve the compression is known as thresholding.

Described below are possible thresholding techniques. Following that description is a comparison of the techniques to a variety of signal functions. As will be shown, energy-based thresholding works best with wavelet-based compression in many applications.

Hard thresholding (HRT) starts with a dataset X ($x_1$, $x_2$, $x_3$, ..., $x_n$) of size n, and selects from the dataset X the "k" coefficients that are largest in magnitude. The choice of the k coefficients is in relation to a threshold "$\lambda$" computed based on the standard deviation ($\sigma$) of the wavelet coefficients at the highest resolution. The threshold $\lambda$, being the standard deviation of the coefficients at the finest level (the most noisy coefficients), is an estimate of the magnitude of noise. An estimate of $\sigma$ is given by $$\hat{\sigma} = \frac{\sum_{i=1}^{n1} |c_i - med(c_i)|}{0.6745},$$

where med($\cdot$) is the median of the coefficients and $n_1$ denotes the number of coefficients at the finest level. The threshold is given by $\lambda = \hat{\sigma}\sqrt{2\log(n)/n}$. The coefficients ($c_i$) in absolute value that exceed λ are retained and those that are less than λ are set to zero. In other words, the hard thresholding returns coefficients $c_i \chi|_{c_i > \lambda}|$, where χ is the indicator function.

Soft thresholding (SFT) is based on the idea of "wavelet shrinkage." Similar to HRT, SFT sets to zero all those coefficients whose absolute values are smaller than λ, and then shrinks the coefficients that exceed λ in absolute value towards zero. The surviving coefficients are given by $c_i^* = \text{sgn}(c_i)(c_i - \lambda)_+$, where sgn(·) is the standard signum function. The term $c_i^*$ is computed only if $(c_i - \lambda)$ is positive; otherwise its value is set to zero. Since λ is the variance of the noise coefficients, $(c_i - \lambda)$ are the de-noised values of the remaining coefficients.

Both hard and soft thresholding are conservative and therefore retain coefficients that do not contribute to the energy in the data. This is less desirable for compression as more non-zero coefficients have to be stored for decompression later. Both hard and soft thresholding techniques discard coefficients based on the threshold λ and produce near zero error in reconstruction. However, neither technique provides the flexibility to adjust the threshold λ. Flexibility is desirable in some applications because space may be a more important factor than perfect reconstruction.

In contrast to both hard and soft thresholding, energy-based thresholding (EBT) generally results in fewer retained coefficients, and hence a greater degree of compression, albeit with some sacrifice in fidelity. In general, the energy of a function f(x) is given by energy=$\frac{1}{2}\int |f(x)|^2 dx$ over the range 0 to 2π. The cumulative energy due to wavelet coefficients then is used to determine the number of coefficients for data smoothing and compression. The Parseval's identity under some conditions states that the sum of squares of wavelet coefficients equals total energy. The square of the $i^{th}$ coefficient $c_i$ is its energy content. Since $c_i = \langle f, \psi_i \rangle$, $c_i$ can be viewed as unnormalized correlation between f and the wavelet function. Cumulative addition of squares of "k" coefficients (arranged in the descending order) captures co-variation explained up to the $k^{th}$ coefficient. Coefficients small in magnitude provide little information and thus can be ignored. By plotting a graph of cumulative energy versus the number of coefficients, a small set of significant coefficients can be selected, which leads to substantial compression.

Figure 2:
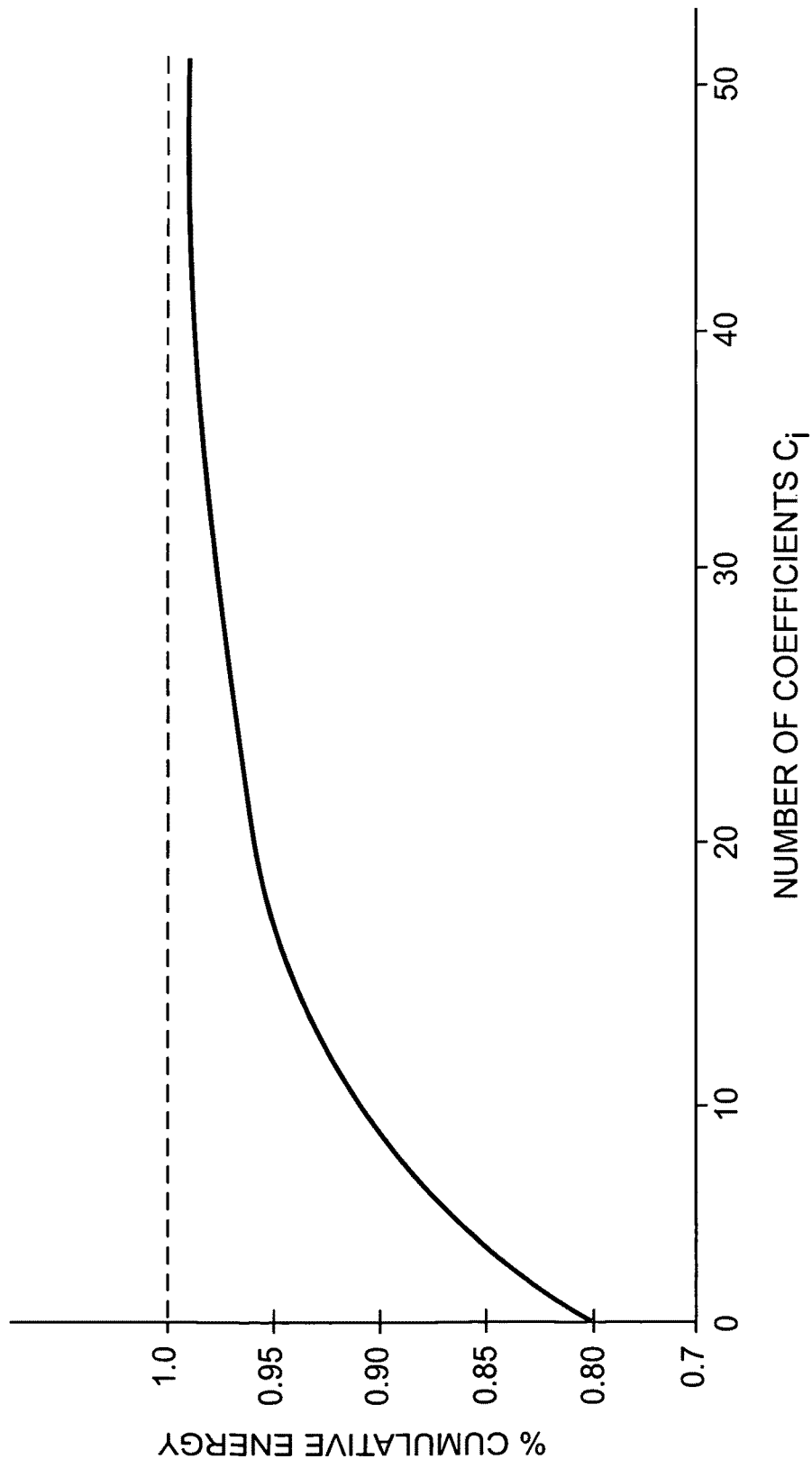
FIG. 2 is a graph illustrating the relationship between a number of wavelet coefficients and their cumulative energy.

This EBT approach uses the cumulative energy (squares of coefficients) to capture information in the data. The graphing parameters are given by the set $$\left\{ i, \sum_{k=1}^{i} c_{(k)}^2 \right\},$$

where "i" indexes the wavelet coefficient $c_{(i)}$ and $$\sum_{k=1}^{i} c_{(k)}^2$$

is the cumulative energy up to the coefficient $c_{(i)}$. A typical plot is given in FIG. 2. As can be seen, for a data-vector of size 64 observations, approximately 25 coefficients contain 95 percent of the information.

Figure 1C:
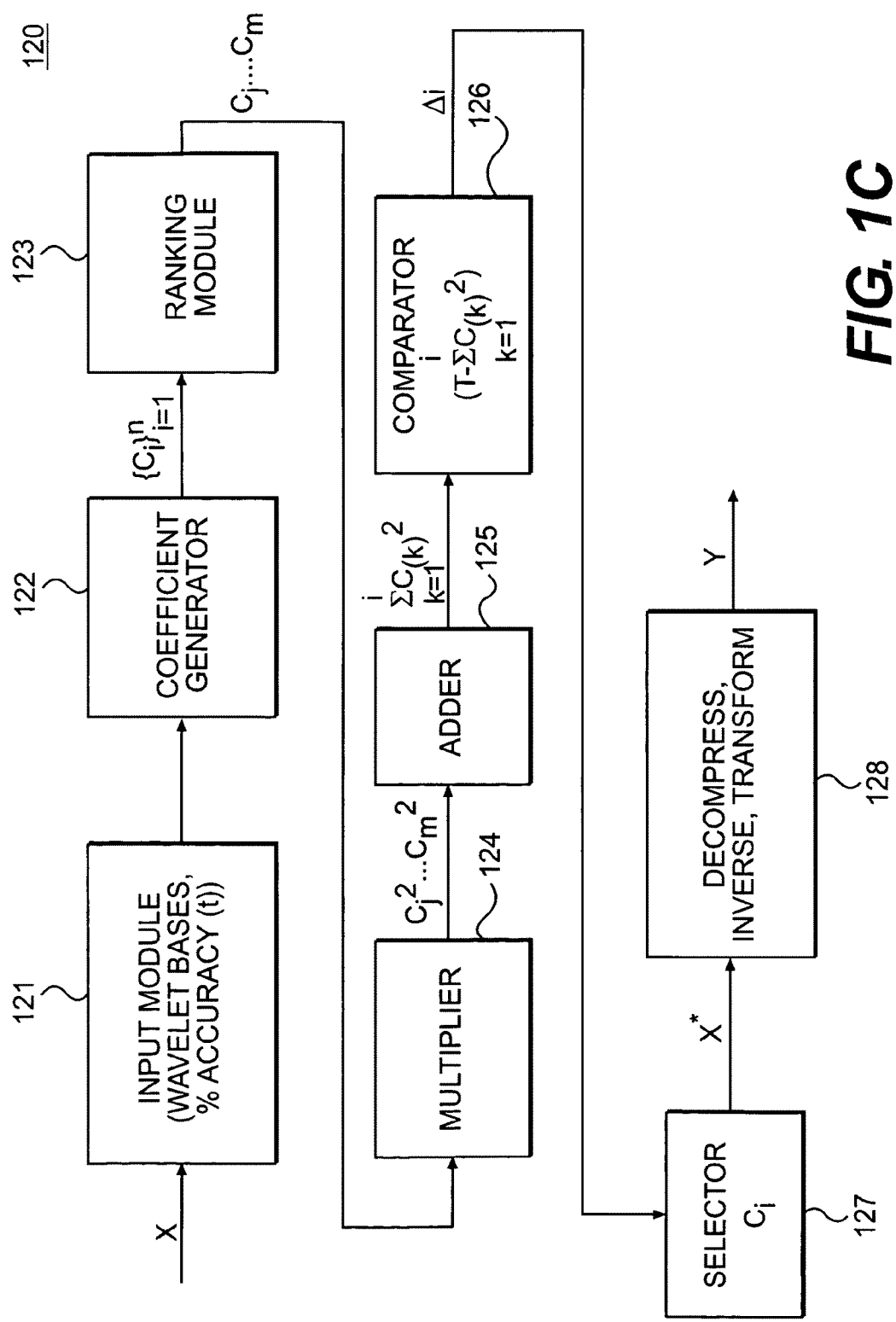
FIG. 1C is a block diagram of an exemplary wavelet transform and energy-based compression module that may be used with the systems of either FIG. 1A or 1B.

Turning to FIG. 1C, operation of the compression module 120 will now be explained. The compression module 120 includes input module 121, coefficient generator 122, ranking module 123, multiplier 124, adder 125, comparator 126, selector 127, and decompression module 128. In an embodiment, the input module 121 may be used to receive a desired wavelet basis function (e.g., Daubachies 4) from the computing platform 20 or other source. In another embodiment, the input module 121 stores pre-determined basis functions, and may either select an appropriate basis function, or receive a selection from one of the stored bases. The stored basis functions may be determined in advance by testing various signal functions and applying the basis functions to data in the database 30. Basis functions that perform well then may be stored.

The input module 121 also may receive a value of desired accuracy for the query 40, expressed as a percentage value, ε. This percentage value ε, or accuracy, is used to determine the degree of compression to apply to the dataset X, in a manner analogous to picking a point on the graph of FIG. 2, as described above.

The coefficient generator 122 generates the set of wavelet coefficients, $\{c_i\}_{i=1}^n$, which measure the relative association of the data attribute values and the selected wavelet basis function. The ranking module 123 places the individual coefficients $c_i$ in rank order from largest to smallest. the multiplier 124 squares the ranked individual coefficients. The adder 125 performs cumulative addition of the squared, ranked individual coefficients $c_i$. The comparator computes the total energy T (sum of the squares of the coefficients) for the dataset X, and subtracts from the total energy T the accumulating sums of the squared, ranked individual coefficients $c_i$ to produce a value $\Delta_i$. Each value $\Delta_i$ is compared to the desired accuracy, and when the desired accuracy is achieved (i.e., $\Delta_i \le \epsilon$), the appropriate number of coefficients is determined. Any remaining coefficients then are discarded by the selector module 127, leaving k coefficients remaining, with k<<n. Finally, the decompression/inverse wavelet transform module 128 uses the k coefficients to rebuild the original dataset X as X*, where X* is accurate within 1−ε of X.

Figure 3A:
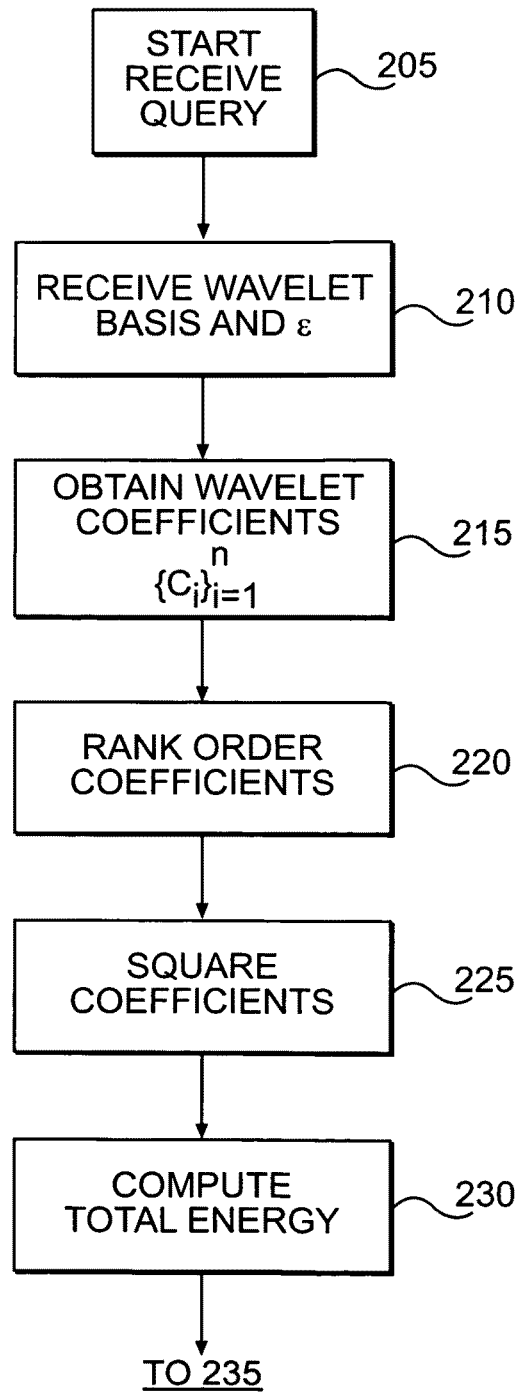
FIGS. 3A and 3B are flowcharts illustrating an exemplary data compression/decompression operation on the system of FIG. 1B.
Figure 3B:
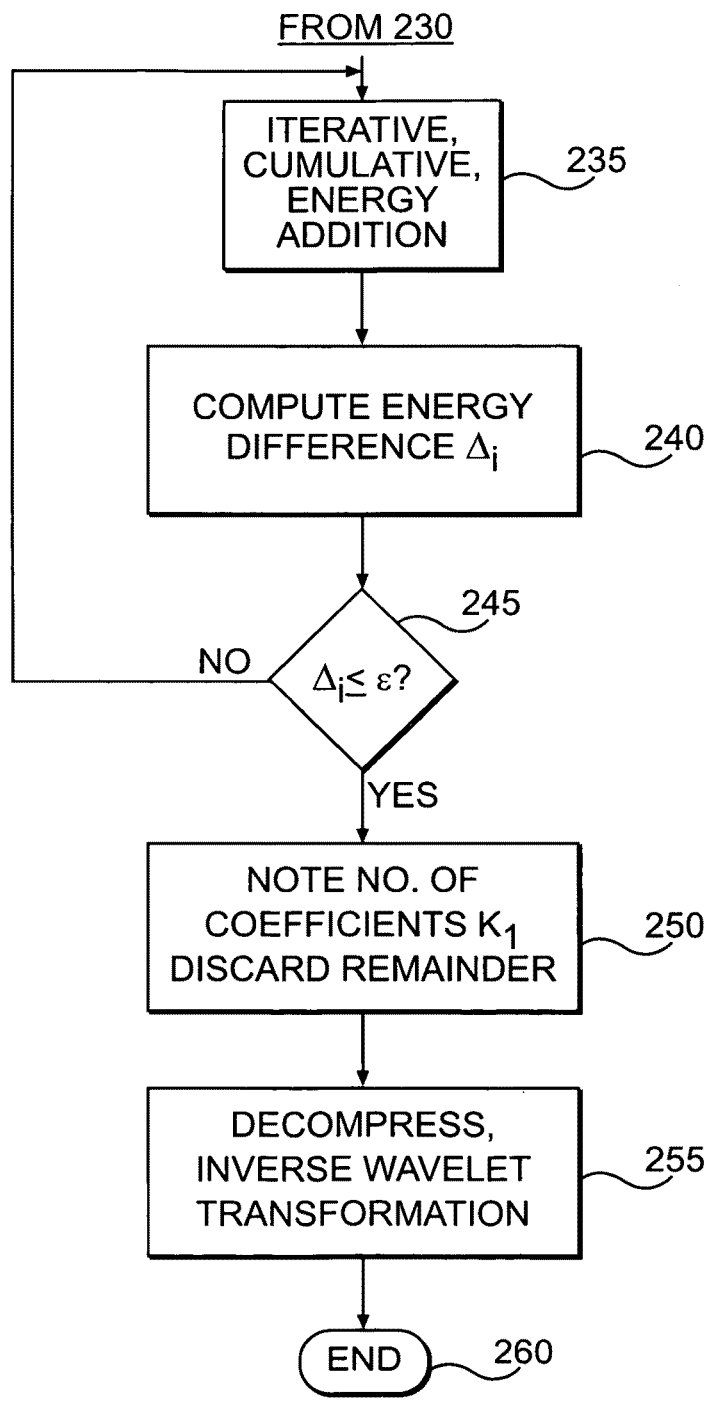

FIGS. 3A and 3B are flowcharts illustrating an exemplary data compression/decompression operation 200 on the system 10 of FIG. 1B. In FIG. 3, the operation 200 begins, block 205, with receipt of a query request from the computing platform 20. In block 210, the compression module 120 receives a wavelet basis for data analysis and compression purposes, along with a desired accuracy value ε. For example, the Daubechies 4 wavelet may be specified, and the desired accuracy may be 5 percent. In block 215, the compression module 120 obtains the wavelet coefficient set $\{c_i\}_{i=1}^n$ by applying the desired wavelet transform to the dataset X. In block 220, the compression module 120 arranges the wavelet coefficients computed at all resolutions in the descending order of magnitude, and denotes the ordered set by $\{c_{(i)}\}_{i=1}^k$, the individual coefficients then are squared, block 225.

In block 230, the compression module 120 computes the total energy T of the dataset X as the sum of the squares of the coefficients. In block 235, the compression module begins an iterative, cumulative addition of the individual squared coefficient values (i.e., the cumulative energy) and a corresponding difference calculation (subtraction − block 240) of the cumulative energy from the total energy T. This cumulative addition/difference process continues until the point (block 245) at which the difference $\Delta_i$ produces the desired accuracy (i.e., $\Delta_i \le \epsilon$). This point then determines (block 250) the number of coefficients to discard, and hence the degree of compression of the original dataset X. This cumulative addition/difference process can be understood with reference to the graph of FIG. 2, which shows percentage of cumulative energy on the y-axis, and number of coefficients on the x-axis. In essence, the compression module 120 "plots" the number coefficients as a function of cumulative correlation given by the sum of ordered wavelet coefficients $\{c_{(i)}\}_{i=1}^{n}$. The compression module 120 the locates the point on the x-axis of the "graph" where the incremental cumulative energy is less than a pre-specified value of $\epsilon$. This point on the x-axis corresponds to coefficients whose cumulative energy contribution is approximately maximal (i.e., the cumulative energy plot "flattens") for recreating the original dataset X.

The compression module then (block 255) uses the k coefficients and inverse wavelet transformation to rebuild the original dataset X as X*, with the desired level of accuracy $\epsilon$. In block 260, the operation 200 ends.

Figure 4:
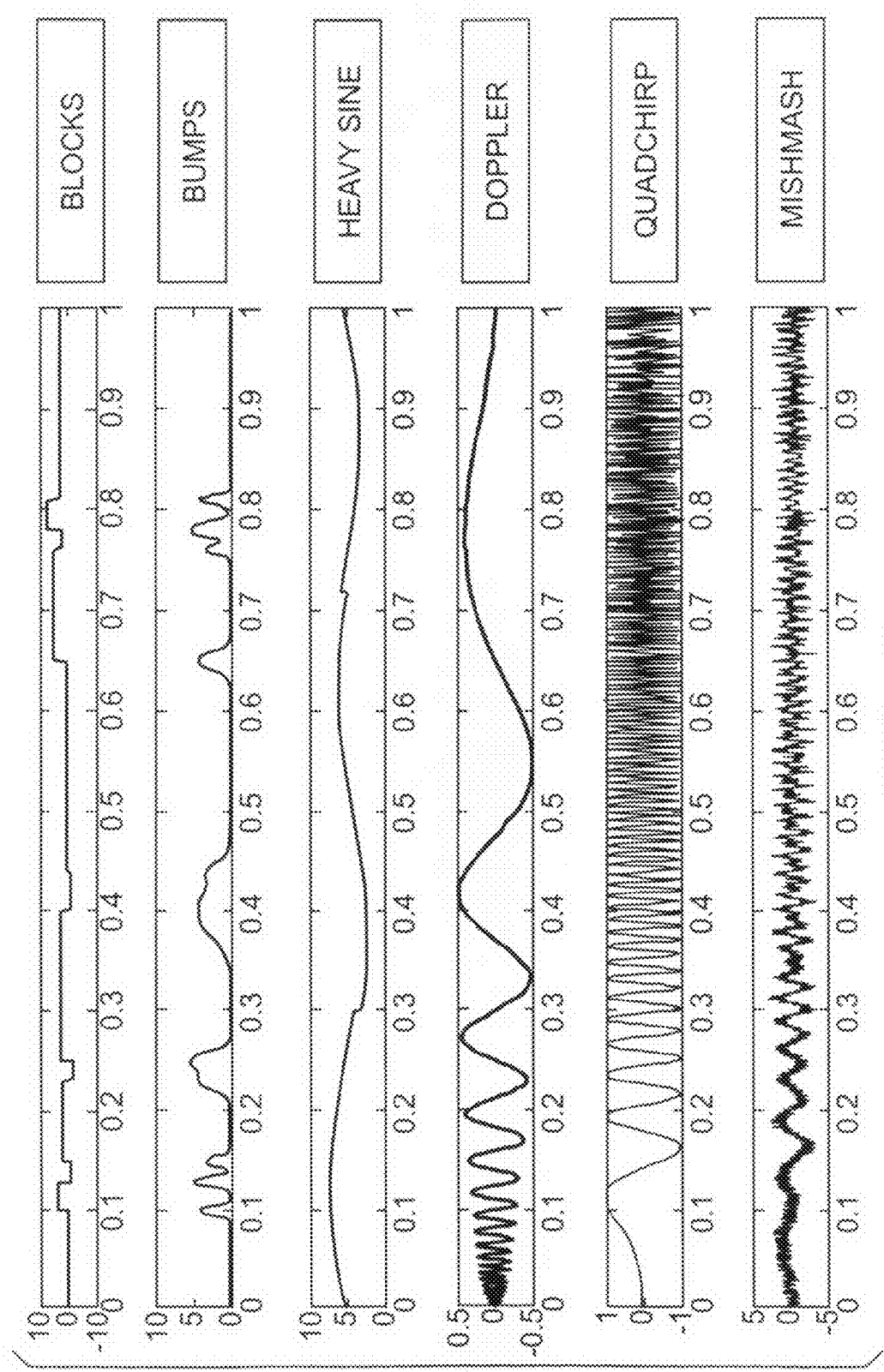
FIG. 4 illustrates exemplary signal functions used for evaluating the performance of thresholding based on a pre-specified value compared to other thresholding techniques.

FIG. 4 illustrates six sample signal functions used to evaluate the relative performance of thresholding based on a pre-specified value compared to other thresholding techniques. Each of the underlying functions is corrupted by Gaussian noise. The sample signal functions are labeled Blocks, Bumps, Heavy Sine, Doppler, Quadchirp, and Mishmash. The three thresholding methods (HRT, SFT, and EBT) are used for determining the a number of coefficients. The three methods are compared relative to amount of energy used in % scale, number of wavelet coefficients used, sum of squares of error (SSE) and relative compression (RC). To measure the quality of reconstruction of the original signal, the sum of squares criterion SSE, given by $$\frac{1}{n}(X_i - X_i^*)^T(X_i - X_i^*),$$

is used, where $X_i$ and $X_i^*$ are, respectively, the original and the reconstructed data vectors. Energy used is measured in % units denoted and given by $$PE = \left(\frac{\sum_{i=1}^{k} c_i^2}{\sum_{i=1}^{k} c_i^2}\right) \times 100, k < n.$$

The statistic RC is used to measure degree of compression relative to hard thresholding and is given as $$RC = \frac{\#(HRT \text{ Coefficients})}{\#(M \text{ Coefficients})}, M \in \{SFT, EBT\}.$$

Values of RC equal to x implies hard thresholding uses x times more coefficients in order to achieve satisfactory compression and reconstruction error. The results are tabulated in Tables 1-4.

TABLE 1

Comparison of the thresholding methods using the Haar wavelet (Db1) analyzing Blocks

| Method | Wavelet | Distribution | n | # of coefficients | Total Energy | energy_used | % energy used | SSE | RC |
|---|---|---|---|---|---|---|---|---|---|
| HRT | Db1 | blocks | 1024 | 62 | 2300 | 2300 | 100.0 | 0.0000 | 1.00 |
| SFT | Db1 | blocks | 1024 | 62 | 2300 | 2300 | 100.0 | 0.0000 | 1.00 |
| EBT | Db1 | blocks | 1024 | 54 | 2300 | 2296.6 | 99.9 | 0.0030 | 0.00 |
| HRT | Db1 | blocks | 16384 | 103 | 36835 | 36835 | 100.0 | 0.0000 | 1.00 |
| SFT | Db1 | blocks | 16384 | 103 | 36835 | 36835 | 100.0 | 0.0000 | 1.00 |
| EBT | Db1 | blocks | 16384 | 76 | 36835 | 36793 | 99.9 | 0.0020 | 1.36 |
| HRT | Db1 | blocks | 32768 | 112 | 73658 | 73658 | 100.0 | 0.0000 | 1.00 |
| SFT | Db1 | blocks | 32768 | 112 | 73658 | 73658 | 100.0 | 0.0000 | 1.00 |
| EBT | Db1 | blocks | 32768 | 76 | 73658 | 73574 | 99.9 | 0.0030 | 1.47 |
| HRT | Db1 | blocks | 65536 | 117 | 147331 | 147331 | 100.0 | 0.0000 | 1.00 |
| SFT | Db1 | blocks | 65536 | 117 | 147331 | 147331 | 100.0 | 0.0000 | 1.00 |
| EBT | Db1 | blocks | 65536 | 76 | 147331 | 147162.82 | 99.9 | 0.0000 | 1.54 |

TABLE 2

Comparison of the thresholding methods using the Haar wavelet (Db1) analyzing Heavy Sine

| Method | Wavelet | Distribution | n | # of coefficients | Total Energy | energy_used | % energy used | SSE | RC |
|---|---|---|---|---|---|---|---|---|---|
| HRT | Db1 | Heavy Sine | 1024 | 410 | 1105 | 1105 | 100.00 | 0.0000 | 1.00 |
| SFT | Db1 | Heavy Sine | 1024 | 410 | 1105 | 1105 | 100.00 | 0.0010 | 1.00 |
| EBT | Db1 | Heavy Sine | 1024 | 97 | 1105 | 1100 | 99.55 | 0.0010 | 4.23 |
| HRT | Db1 | Heavy Sine | 16384 | 6213 | 17693 | 17693 | 100.00 | 0.0000 | 1.00 |
| SFT | Db1 | Heavy Sine | 16384 | 6213 | 17693 | 17693 | 100.00 | 0.0000 | 1.00 |
| EBT | Db1 | Heavy Sine | 16384 | 101 | 17693 | 17692 | 99.99 | 0.0010 | 61.51 |
| HRT | Db1 | Heavy Sine | 32768 | 12262 | 35388 | 35388 | 100.00 | 0.0000 | 1.00 |
| SFT | Db1 | Heavy Sine | 32768 | 12262 | 35388 | 35388 | 100.00 | 0.0000 | 1.00 |
| EBT | Db1 | Heavy Sine | 32768 | 101 | 35388 | 35387 | 100.00 | 0.0010 | 121.41 |
| HRT | Db1 | Heavy Sine | 65536 | 24185 | 70777 | 67371 | 95.19 | 0.0000 | 1.00 |
| SFT | Db1 | Heavy Sine | 65536 | 24185 | 70777 | 67371 | 95.19 | 0.0000 | 1.00 |
| EBT | Db1 | Heavy Sine | 65536 | 101 | 70777 | 67362 | 95.17 | 0.0010 | 239.46 |

TABLE 3

Comparison of the thresholding methods using the Haar wavelet (Db1) analyzing Doppler

| Method | Wavelet | Distribution | n | # of coefficients | Total Energy | energy_used | % energy used | SSE | RC |
|---|---|---|---|---|---|---|---|---|---|
| HRT | Db1 | doppler | 1024 | 420 | 1051.60 | 1051.30 | 99.97 | 0.0003 | 1.00 |
| SFT | Db1 | doppler | 1024 | 420 | 1051.60 | 1023.70 | 97.35 | 0.0020 | 1.00 |
| EBT | Db1 | doppler | 1024 | 305 | 1051.60 | 1050.60 | 99.90 | 0.0010 | 1.38 |
| HRT | Db1 | doppler | 16384 | 5253 | 16842.00 | 16842.00 | 100.00 | 0.0000 | 1.00 |
| SFT | Db1 | doppler | 16384 | 5253 | 16842.00 | 16827.00 | 99.91 | 0.0000 | 1.00 |
| EBT | Db1 | doppler | 16384 | 437 | 16842.00 | 16825.00 | 99.90 | 0.0010 | 12.02 |
| HRT | Db1 | doppler | 32768 | 10096 | 33685.00 | 33685.00 | 100.00 | 0.0000 | 1.00 |
| SFT | Db1 | doppler | 32768 | 10096 | 33685.00 | 33685.00 | 100.00 | 0.0000 | 1.00 |
| EBT | Db1 | doppler | 32768 | 437 | 33685.00 | 33673.00 | 99.96 | 0.0010 | 23.10 |
| HRT | Db1 | doppler | 65536 | 19415 | 67371.00 | 67371.00 | 100.00 | 0.0000 | 1.00 |
| SFT | Db1 | doppler | 65536 | 19415 | 67371.00 | 67371.00 | 100.00 | 0.0000 | 1.00 |
| EBT | Db1 | doppler | 65536 | 436 | 67371.00 | 67362.00 | 99.99 | 0.0010 | 44.53 |

TABLE 4

Comparison of the thresholding methods using the Daubechies 4 wavelet (Db4) analyzing Doppler

| Method | Wavelet | Distribution | n | # of coefficients | Total Energy | energy_used | % energy used | SSE | RC |
|---|---|---|---|---|---|---|---|---|---|
| HRT | Db4 | Doppler | 1024 | 543 | 87.33 | 87.33 | 100.00 | 0.0000 | 1.00 |
| SFT | Db4 | Doppler | 1024 | 543 | 87.33 | 86.77 | 99.36 | 0.0000 | 1.00 |
| EBT | Db4 | Doppler | 1024 | 398 | 87.33 | 86.82 | 99.42 | 0.0000 | 1.36 |
| HRT | Db4 | Doppler | 16384 | 559 | 87.83 | 87.83 | 100.00 | 0.0000 | 1.00 |
| SFT | Db4 | Doppler | 16384 | 559 | 87.83 | 87.52 | 99.65 | 0.0000 | 1.00 |
| EBT | Db4 | Doppler | 16384 | 398 | 87.83 | 86.92 | 98.96 | 0.0000 | 1.40 |
| HRT | Db4 | Doppler | 32768 | 565 | 87.83 | 87.83 | 100.00 | 0.0000 | 1.00 |
| SFT | Db4 | Doppler | 32768 | 565 | 87.83 | 87.6 | 99.74 | 0.0000 | 1.00 |
| EBT | Db4 | Doppler | 32768 | 398 | 87.83 | 86.92 | 98.96 | 0.0000 | 1.42 |
| HRT | Db4 | Doppler | 65536 | 570 | 87.83 | 87.83 | 100.00 | 0.0000 | 1.00 |
| SFT | Db4 | Doppler | 65536 | 570 | 87.83 | 87.66 | 99.81 | 0.0000 | 1.00 |
| EBT | Db4 | Doppler | 65536 | 398 | 87.83 | 86.92 | 98.96 | 0.0000 | 1.43 |

Tables 1-3 summarize application of the Haar square-wave basis (Db1) to data generated by the "Blocks," "Heavy Sine," and "Doppler" functions contaminated by noise. Table 4 summarizes application of the Daubechies 4 wavelet (Db4) to the Doppler function.

Applying the Haar (Db1) wavelet system to the "Blocks" function, which carries a significant low-frequency component, reveals that DB1 models the data well by "using few coefficients." The three thresholding methods are comparable, with EBT yielding greater compression. The error between the reconstructed vector (X*) and the original (X) is larger for EBT, but still is miniscule. For larger sample sizes, the reconstruction error drops as can be seen clearly from Table 1. When the Db1 wavelet is applied to more complicated functions such as "Heavy Sine" and "Doppler," the EBT procedure uses far fewer coefficients than the HRT and SFT. Error in reconstruction, while nearly zero when HRT or SFT is used, is negligible when using the EBT.

Considering the results shown in Tables 1-3, EBT is the best performing thresholding mechanism relative to the statistic RC. EBT achieves a ratio (RC) as high as 239 for the Heavy Sine signal with a sample size of 65536. EBT in general consistently outperforms HRT and SFT. Another noticeable feature is that while the degree of compression by EBT does not vary with sample size when the analyzing function is Db1, the number of coefficients determined using HRT or SFT increases proportional to the sample size. As the sample size increases, the thresholding constant λ (which is a function of sample standard deviation ($\hat{\sigma}$, n)) decreases, admitting more coefficients. One inference to be drawn from the experimental results is that if the transform of choice is the Haar wavelet, thresholding by EBT provides substantial compression while preserving original signal properties.

The Daubichies Db4 and Db10 wavelets are more sophisticated than the Haar wavelet and are well suited to model non-linear functions with high frequency. The three thresholding mechanisms are comparable relative to accuracy, but EBT is more parsimonious in the selection of the coefficients to retain. From the summary results shown in Table 4, it is clear that Db4 requires far fewer coefficients than Db1 since the Daubechies wavelet is more suitable for signal functions showing sharp spikes and discontinuities. What also is noticeable is that all the three thresholding methods reproduce the original vector (X) perfectly (i.e., SSE=0.0). In summary, wavelet bases in conjunction with EBT provide a reliable framework for accurately characterizing, compressing, and reconstructing the original data vector X.

Performance of the three thresholding mechanisms also was analyzed for small sample sizes (32, 64, and 256), with the results presented in Table 5. Note that EBT admits fewer coefficients for reconstruction, but the accuracy is diminished relative to HRT. In general, SFT is the least accurate among the three. Also notice that energy used by SFT tends to be smaller. This is noticeable for small samples, because SFT shrinks coefficients closer to zero. However, EBT gives the user the leeway to reduce the gap in accuracy with HRT by increasing the cut off point to let more coefficients during decompression.

TABLE 5

Relationship between number coefficients required and accuracy of reconstruction

| Distribution | Wavelet | n | Desired Accuracy | Number of Coefficients |
|---|---|---|---|---|
| Doppler | Db1 | 16 | 5% | 9 |
| Doppler | Db1 | 16 | 10% | 7 |
| Doppler | Db1 | 32 | 5% | 16 |
| Doppler | Db1 | 32 | 10% | 12 |
| Doppler | Db1 | 64 | 5% | 24 |

TABLE 5-continued

Relationship between number coefficients required and accuracy of reconstruction

| Distribution | Wavelet | n | Desired Accuracy | Number of Coefficients |
|---|---|---|---|---|
| Doppler | Db1 | 64 | 10% | 16 |
| Doppler | Db1 | 128 | 5% | 36 |
| Doppler | Db1 | 128 | 10% | 24 |
| Doppler | Db1 | 256 | 5% | 43 |
| Doppler | Db1 | 256 | 10% | 26 |
| Doppler | Db1 | 512 | 5% | 44 |
| Doppler | Db1 | 512 | 10% | 26 |

Energy based thresholding is adaptive in the sense of providing the flexibility to the user in compressing the data to accommodate constraints such as limited memory and adjust degree of compression subject to pre-specified percent accuracy levels. One way to apply EBT, as described above is to consider the totality of all wavelet coefficients across all levels en masse to determine a universal thresholding constant, in the case of (HRT, SFT) and total energy in the case of EBT. However, in some applications, the variance of the wavelet coefficients will depend on the decomposition level, but will tend to be constant within each level when the value distribution is stationary and correlated. Such applications might, therefore, benefit from a variance of the above-described EBT by incorporating a degree of level dependence into the thresholding process, referred to hereafter as level dependent thresholding (LDT). In LDT, the compression module 120 (FIG. 1B) computes level total energy and selects coefficients within that level that capture a large proportion of the information. After all levels are processed, the compression module 120 combines the surviving coefficients at each level into a single compressed vector and uses that single compressed vector for decompression. Table 6 shows the performance of level dependent energy based thresholding (LDT). As is evident from the results, LDT outperforms HRT and SFT. In general, if an application requires reconstructing vectors at various levels in a hierarchy, LDT produces superior results. An example of such a hierarchy is the configuration of a data center. Topologically, a server has several inlet/outlet sensors, multiple servers belong to a rack, racks belong to a zone, and multiple zones constitute the data center. Within that hierarchical architecture, it may be desirable to compress data at the $i^{th}$ level in the hierarchy. In that scenario, LDT may out-perform HRT and SFT.

TABLE 6

Comparing HRT, SFT, and EBT using level dependent thresholding (LDT)

| Method | Wavelet | Distribution | n | # of Coefficients | Total Energy | Energy_Used | % Energy Used | SSE | RC |
|---|---|---|---|---|---|---|---|---|---|
| HRT | Db4 | Doppler | 16384 | 404 | 1418.20 | 1406.60 | 100.00 | 0.2717 | 1.00 |
| SFT | Db4 | Doppler | 16384 | 404 | 1417.80 | 1406.60 | 99.98 | 0.2717 | 1.00 |
| LDT | Db4 | Doppler | 16384 | 228 | 568.80 | 1406.40 | 90.02 | 0.1686 | 1.77 |
| HRT | Db4 | Quadchirp | 16384 | 9143 | 8045.40 | 8045.10 | 100.00 | 1.2028 | 1.00 |
| SFT | Db4 | Quadchirp | 16384 | 9143 | 8045.40 | 7768.20 | 96.55 | 1.1856 | 1.00 |
| LDT | Db4 | Quadchirp | 16384 | 4085 | 8045.40 | 74.10 | 0.92 | 0.5042 | 2.24 |
| HRT | Db4 | Bumps | 16384 | 3854 | 6109.70 | 6109.10 | 99.99 | 0.0000 | 1.00 |
| SFT | Db4 | Bumps | 16384 | 3854 | 6109.70 | 5475.20 | 89.61 | 0.0070 | 1.00 |
| LDT | Db4 | Bumps | 16384 | 3791 | 6109.70 | 5689.80 | 93.13 | 0.0900 | 1.02 |
| HRT | Db4 | Mishmash | 16384 | 15258 | 24717.00 | 24716.00 | 100.00 | 3.4156 | 1.00 |
| SFT | Db4 | Mishmash | 16384 | 15258 | 24717.00 | 23558.00 | 99.98 | 3.3466 | 1.00 |
| LDT | Db4 | Mishmash | 16384 | 11217 | 24717.00 | 15774.00 | 90.02 | 3.3466 | 1.36 |

Returning to FIG. 1A, the illustrated processing system 1 may be used in a digital camera for in-camera image processing and storage, and for subsequent image transmission, if desired. As applied to a digital camera, the data input module 2 provides an input data file X, and includes an analog signal capture mechanism and an analog to digital converter; the pre-processing module 3 converts the digitized RGB signal into another space, such as Y, Cb, Cr (luminance and color difference signals); the wavelet transformation, compression, and decompression module 4 applies a wavelet transform basis function to the Y, Cb, Cr data to produce a set of transform coefficients, discards certain of the coefficients, thereby achieving a measure of compression, and then uses the non-discarded coefficients to reconstruct an output data file X* (e.g., a thumbnail image), as well as a data file Y which is an interpolated version of the output data file X* and represents a color image that is viewable by a human user; the control data module 5 may be used to select the degree of compression used by the module 4; the application 6 may simply be an in-camera memory that stores compressed images (e.g., the data file X*); the data output module 7 may be used to display the thumbnail image (data file X*) on, for example, an in-camera LCD display; and the data output module 8 may be used to transmit the data file Y (e.g., download file Y to a computer).

We claim:
1. A system including hardware that comprises:
a data input module that supplies a data input; and
a wavelet transformation and compression module coupled to the data input module, wherein the wavelet transformation and compression module receives a representation of the input data, the wavelet transformation and compression module comprising:

an input module comprising a wavelet basis function, a wavelet coefficient generator that computes a plurality of wavelet coefficients based on the wavelet basis function and the representation of the input data, a ranking module that orders the plurality of wavelet coefficients, a coefficient multiplier that computes an energy value for each wavelet coefficient, an adder that iteratively computes cumulative energy as a function of the number of coefficients, and a comparator that compares total energy of the data input to the iterative, cumulative energy and selects a number of coefficients whose cumulative energy is substantially invariant with additional coefficients, wherein the selected number of coefficients results in compression of the data input.

2. The system of claim 1, further comprising a pre-processing module coupled between the data input module and the wavelet transformation and compression module, wherein the input data are translated into the representation of the input data.

3. The system of claim 1, wherein the suitably programmed device is a hardware device.

4. The system of claim 1, wherein the suitably programmed device is a software-programmable processor.

5. The system of claim 1, wherein a point where the cumulative energy is substantially invariant is adjustable according to a pre-selected accuracy level.

6. The system of claim 1, further comprising a decompression module that expands and inverse wavelet transforms the compressed data input, producing decompressed output data.

7. The system of claim 1, wherein the decompressed data are provided to a query optimizer to generate a query plan for searching a database.

8. The system of claim 1, wherein the data input comprises an analog image signal and the compressed data comprises a thumbnail image.

9. The system of claim 1, wherein the wavelet basis function is the Daubechies 4 wavelet.

10. The system of claim 1, wherein the input module further comprises a pre-determined accuracy value, wherein the comparator bases the number of coefficients to be selected on the pre-determined accuracy value.

11. The system of claim 1, wherein the data input comprises a plurality of levels, and wherein the wavelet transformation and compression module:
computes cumulative energy at each of the levels;
selects a number of coefficients at each level, wherein cumulative energy of the selected coefficients is substantially invariant with additional coefficients; and
combines the coefficients selected at each level to produce a decompression vector.

12. A method, implemented on a suitably programmed device, for compressing a dataset using energy-based wavelet thresholding, comprising the steps of:
(a) receiving a representation of an original data set;
(b) determining an operation to be performed on the received original data set;
(c) receiving a wavelet basis function to apply to the original data set;
(d) using the received wavelet basis function, transforming the original data set X into a set of coefficients;
(e) ordering the set of coefficients into an ordered set;
(f) squaring each of coefficient of the ordered set;
(g) computing the total energy of the ordered set;
(h) performing iterative, cumulative addition of the squared components of the ordered set;
(i) subtracting the iteratively and cumulatively added squared components ordered set from the total energy until a point of near-invariant differences is reached, wherein a number of squared coefficients cumulatively added comprises a compression value; and
(j) deleting remaining coefficients in order to produce a compressed data set.

13. The method of claim 12, further comprising:
decompressing the compressed data set; and
performing an inverse wavelet transformation to produce a reduced data set.

14. The method of claim 12, further comprising:
receiving a pre-specified accuracy value; and using the accuracy value to determine the point of near-invariant differences.

15. The method of claim 12, wherein the operation is a query optimization operation comprising developing a query plan to search a database.

16. The method of claim 12, wherein the method is a digital image storage operation.

17. The method of claim 12, wherein the wavelet basis function is a Daubechies wavelet function.

18. The method of claim 12, wherein the input data X comprises a plurality of data-levels, the method comprising:
performing steps (a)-(j) for each level; and
combining coefficients from each level to produce a combined decompression vector.

19. A data transformation, compression, and decompression system that includes hardware and comprises:
a compression module that:
applies a wavelet basis function to an input data stream to produce a set of coefficients, squares and ranks the coefficients, and produces an iterative sum of the squared, ranked coefficients to produce cumulative energy,
calculates total energy and iteratively subtracts the cumulative energy from the total energy to produce a difference value, and
compares the difference value to an approximately maximal cumulative energy threshold to determine a number of coefficients to retain, wherein the retained coefficients are used to compress the input data stream.

20. The system of claim 19, wherein the threshold value is a predetermined accuracy level, and wherein the compression module further comprises a decompression and inverse wavelet transformation module.

* * * * *